United States Patent
Ramsbey et al.

(10) Patent No.: US 6,232,630 B1
(45) Date of Patent: May 15, 2001

(54) LIGHT FLOATING GATE DOPING TO IMPROVE TUNNEL OXIDE RELIABILITY

(75) Inventors: Mark T. Ramsbey, Sunnyvale; Tuan Pham, Santa Clara; Yu Sun, Saratoga; Kenneth Wo-Wai Au, Fremont; David H. Chi, Sunnyvale, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/348,583

(22) Filed: Jul. 7, 1999

(51) Int. Cl.$^7$ ................................................. H01L 29/72
(52) U.S. Cl. ..................... 257/314; 257/315; 257/316; 257/318
(58) Field of Search ................................ 257/314, 316, 257/318

(56) References Cited

U.S. PATENT DOCUMENTS

| | | | |
|---|---|---|---|
| 4,603,402 | * | 7/1986 | Cuppens et al. ............... 257/321 |
| 4,608,585 | * | 8/1986 | Keshtbod ....................... 257/321 |
| 4,789,773 | | 12/1988 | Cox et al. . |
| 5,371,027 | | 12/1994 | Walker et al. . |
| 5,591,681 | | 1/1997 | Wristers et al. . |

* cited by examiner

Primary Examiner—Edward Wojciechowicz

(57) ABSTRACT

The reliability of a tunnel oxide is improved by light doping of the floating gate, as with phosphorous or arsenic atoms. Doping can be implemented by ion implantation or by in situ deposition. The relatively low dopant concentration further enhances charge retention on the floating gate.

5 Claims, 3 Drawing Sheets

111 (Doped Amorphous Polysilicon Floating Gate)
113 (Tunnel Oxide)
115 (Substrate)

101 (Control Gate)
103 (Dielectric Layer)
105 (Floating Gate)
107 (Tunel Oxide)

LIGHT FLOATING GATE DOPING TO IMPROVE TUNNEL OXIDE RELIABILITY

TECHNICAL FIELD

The present invention relates to non-volatile memory semiconductor devices. The present invention has particular applicability to non-volatile memory semiconductor devices having a design rule less than about 0.18 microns.

BACKGROUND ART

As the processing power of today's computers exponentially increase, attention is turned to other components of the computer system to achieve corresponding system performance gains. One such component is memory. Memory manufacturers must, accordingly, devote efforts to enhancing performance while minimizing costs. This objective becomes problematic as the demands for device miniaturization drives design rules to 0.18 microns and below. It recognized that high quality dielectrics are needed in such devices to achieve device performance both in terms of speed and longevity.

Conventional non-volatile memory semiconductor devices comprise a stacked gate structure as illustrated in FIG. 1A. Typically, a floating gate 105 comprising polycrystalline silicon (polysilicon) is deposited onto a semiconductor substrate or epitaxial layer grown thereon (not shown) with a thin tunnel oxide layer 107, therebetween. A dielectric layer 103 (e.g., oxide/nitride/oxide, nitride/oxide, thermal oxide, HTO, etc.), is formed on floating gate 105 and a control gate 101, such as polysilicon, is formed on dielectric layer 103. Through manipulation of the control gate, electrons "tunnel" through the tunnel oxide to or from the floating gate. This tunnel effect is known as Fowler-Nordheim tunneling. The read/write capability of the memory cell relates to the charge state of the floating gate electrode, which is a function of the threshold voltage of the MOS transistor. The current through the tunnel oxide turns the memory cell on or off and, therefore, is instrumental in the performance of the cell.

To ensure that the appropriate amount of current flows through the tunnel oxide, conventional memory cells require that the tunnel oxide film be very thin, e.g., about 100 Å for fast operations. Unfortunately, thin tunnel oxide layers are accompanied by parasitic capacitance problems. Also, the breakdown voltage may fall below unacceptable levels. A poor breakdown voltage level may be attributed to trapping of electric charge in the oxide. This trapping effect can be mitigated through the use of higher quality oxides, which trap less charge and, thus, can withstand higher induced voltages before breakdown. In addition, the tunnel oxide layer may undergo degradation during photolithographic processing.

Basically, the engineering tradeoff is between speed of read/write operations and tunnel oxide thickness. A thinner tunnel oxide layer creates a stronger electric field between the gate and the source or drain. As a result of this intense electric field, the electrons in the thin tunnel oxide layer travel faster than they would in a thicker tunnel oxide layer. This rush of electrons translates into improved speed of the memory cell operations. However, as the tunnel oxide layer is thinned, pin holes emerge, resulting in reliability problems. Consequently, a minimal thickness must be maintained to avoid potential reliability issues. A standard test for determining oxide reliability is high temperature retention bake (HTRB).

It is recognized that high quality tunnel oxides serve a crucial role in the fabrication of semiconductor devices. A variety of methods have been developed in an attempt to optimize the engineering tradeoff.

U.S. Pat. No. 5,371,027 discloses that implantation of the tunnel oxide with a heavy ion, such as arsenic, can improve the tunnel oxide quality. During ion implantation, silicon atoms are dislodged from the underlying silicon into the tunnel oxide, producing a silicon enriched region within the tunnel oxide. The altered tunnel oxide layer subsequently assumes new tunneling characteristics. Of significance is the fact that thicker tunnel oxides can be used without compromising the level of current flow through the tunnel. That is, the current flow is comparable to that exhibited by thinner tunnel oxides. This method also avoids oxide degradation due to photolithographic processing by eliminating the need for direct contact between the tunnel oxide and photoresist layers. This method improves tunnel oxide behavior by allowing the use of a thicker oxide (about 200 Å) to achieve current flow comparable to that of a thin oxide (about 100 Å or less).

Another approach is disclosed in U.S. Pat. No. 5,591,681 and comprises oxidizing the substrate region containing a heavily-doped N+ layer. Next, an annealing process, under a gettering ambient, densities the oxide and provides doping at the oxide surface. A further oxidation step thickens the oxide. Subsequently, an NO anneal introduces nitrogen to improve the characteristics of the tunnel oxide as well as the gate. Because both floating gate and tunnel oxide are doped, doping control is more complex than the monitoring of a single layer.

In another process, as described in U.S. Pat. No. 4,789,883, the floating gate is formed of amorphous silicon instead of the conventional polysilicon. The amorphous silicon, about 2500 Å in thickness, is ion implanted with an arsenic or phosphorous dopant. Whereas the patent is concerned with in situ doping of the amorphous silicon.

There remains a need for non-volatile memory semiconductor devices having improved tunnel oxide quality, particularly for semiconductor devices having a design rule of about 0.18 microns and under.

DISCLOSURE OF THE INVENTION

An advantage of the present invention is a non-volatile memory semiconductor device with improved tunnel oxide reliability and high voltage breakdown characteristics.

Another advantage of the present invention is a non-volatile memory semiconductor device comprising a floating gate electrode with increased charge retention.

Yet another advantage involves increased miniaturization of non-volatile memory semiconductor devices, whereby thin tunnel oxides may be utilized without compromising performance.

According to the present invention, the foregoing and other advantages are achieved in part by a semiconductor device comprising: a tunnel dielectric layer on a semiconductor substrate; a floating gate electrode comprising polycrystalline silicon on the tunnel dielectric layer; a dielectric layer on the floating gate; and a control gate on the dielectric layer, wherein the floating gate is doped with impurity atoms at a concentration of about $1\times10^{15}$ atoms/cm$^3$ to about $2\times10^{20}$ atoms/cm$^3$.

A further aspect of the invention is a method of manufacturing a semiconductor device comprising: forming a tunnel dielectric layer on a semiconductor substrate comprising a polycrystalline silicon; forming a floating gate electrode layer comprising polycrystalline silicon and doped with impurity atoms at a concentration of about $1\times10^{15}$ atoms/cm$^3$ to about $2\times10^{20}$ atoms/cm$^3$, on the tunnel dielectric layer; forming a dielectric layer on the floating gate; forming a control gate layer on the dielectric layer; and patterning to form a gate electrode stack comprising, sequentially, a tunnel dielectric layer, floating gate, dielectric layer and control gate.

Additional advantages of the present invention will become readily apparent to those skilled in this art from the following detailed description, wherein only the preferred embodiment of the invention is shown and described, simply by way of illustration of the best mode contemplated for carrying out the present invention. As will be realized, the invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

The present invention achieves the technological advantages of providing a non-volatile semiconductor device having an improved tunnel oxide reliability and high voltage breakdown characteristics. In accordance with embodiments of the present invention, such advantages are achieved by strategically doping the floating gate at a relatively low concentration. It was found that a low doping concentration promotes the formation of a higher quality tunnel oxide layer. The tunnel dielectric layer can comprise any of a variety of insulating materials conventionally employed in the art as a tunnel dielectric layer, e.g., oxides and nitrides. In conventional approaches, tunnel dielectric quality improvement is achieved by directly processing the tunnel dielectric itself. However, according to embodiments of the present invention, improved tunnel dielectric quality is attained without directly processing or treating the tunnel dielectric layer.

Figure 1B:
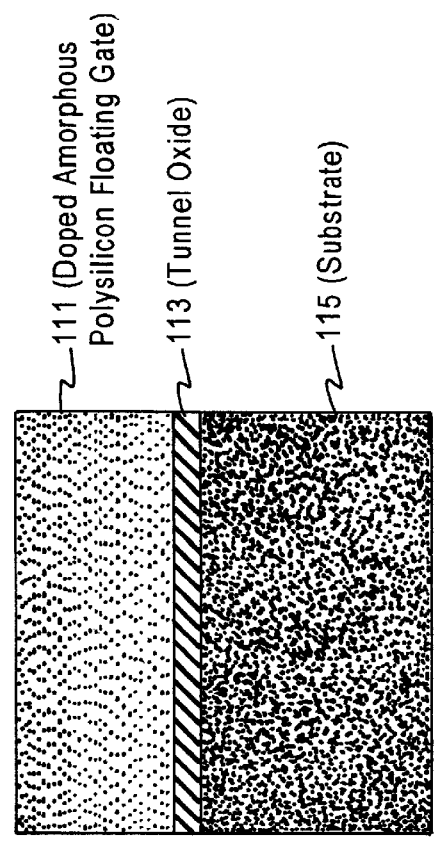
FIG. 1B illustrates a conventional doped amorphous polysilicon floating gate structure.
Figure 1A:
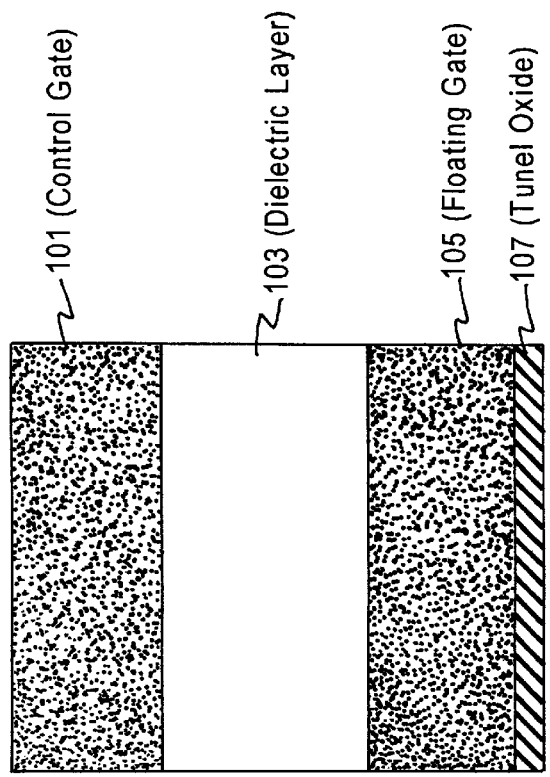
FIG. 1A illustrates the various layers of a conventional stacked gate structure of an electrically erasable programmable read only memory (EEPROM) device.
Figure 2:
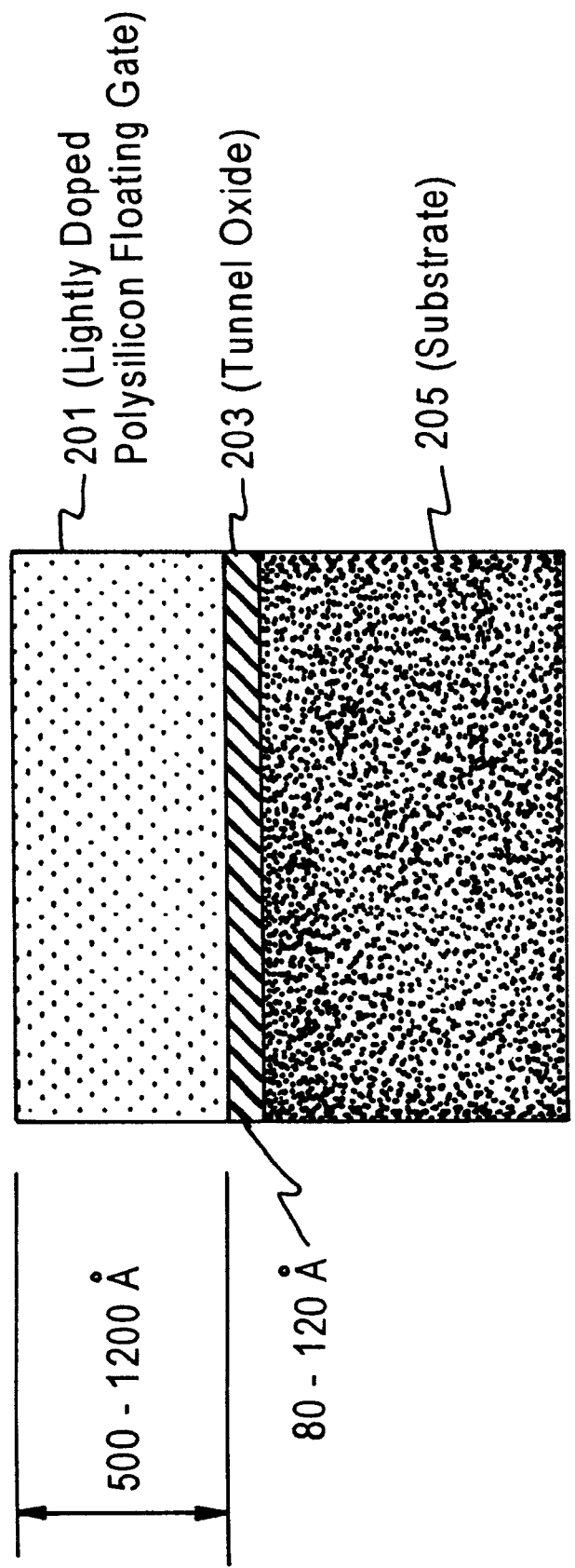
FIG. 2 shows a lightly doped polysilicon floating gate in accord with an embodiment of the present invention.

An embodiment of the present invention is illustrated in FIG. 2, wherein substrate 205 is overlaid with a tunnel dielectric layer 203 comprising silicon oxide at a thickness of about 80 Å to about 120 Å. Other suitable insulating materials include silicon nitride. Above the tunnel oxide 203, is a polysilicon layer 201, formed on tunnel dielectric layer 203. The polysilicon layer 201 typically has a thickness of about 500 Å to about 1200 Å, e.g., about 400 Å to about 2000 Å.

Embodiments of the present invention include forming the doped polysilicon floating gate electrode in any of various ways. For example, an in situ doped polysilicon layer can be deposited, or an undoped polysilicon layer can be deposited and subsequently doped, as by ion implantation. Such methods advantageously involve processing the semiconductor device at relatively low temperatures. Doping of the polysilicon is required to achieve the necessary level of conductivity. The in situ doping embodiment, as illustrated in FIG. 3A, advantageously enables streamlining processing steps.

In practicing the embodiments of the present invention, any of various dopant impurities can be employed, e.g., phosphorous and arsenic can be used. A suitable deposit concentration employed in the present invention is about $1\times10^{15}$ atoms/cm$^3$ to about $2\times10^{20}$ atoms/cm$^3$; e.g., about $5\times10^{18}$ atoms/cm$^3$ to about $2\times10^{20}$ atoms/cm$^3$. The dopant impurity concentration profile is substantially uniform. The polysilicon layer can be deposited by any of a number of conventional deposition techniques (e.g., chemical vapor deposition (CVD), low-pressure chemical vapor (LPCVD) and plasma enhanced chemical vapor deposits (PECVP)).

Figure 3B:
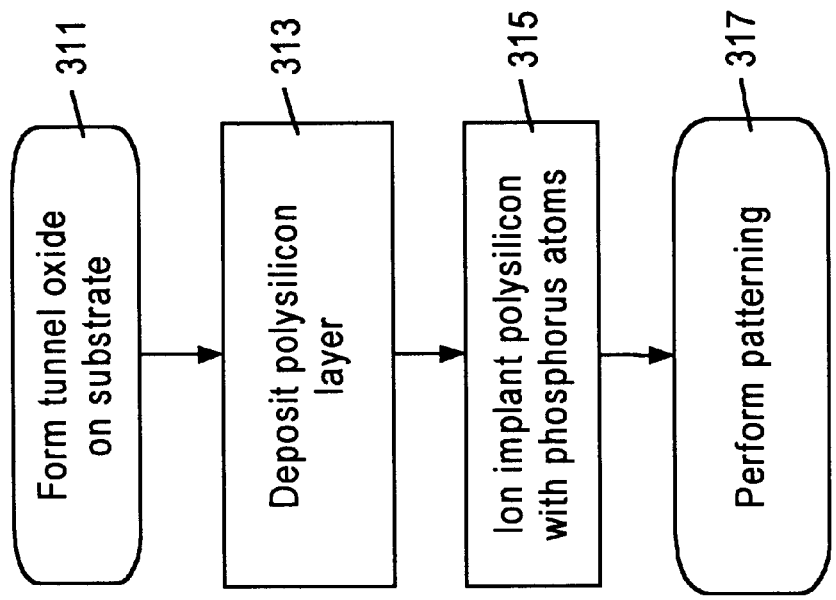
FIG. 3B illustrates the process flow of another embodiment of the present invention employing ion implantation.

Ion implantation, as shown in FIG. 3B, advantageously enables greater control of the dopant impurities. The impurity concentration profile is substantially uniform after annealing at a temperature of about 600° C. to about 100° C. Given the guidance of the present disclosure, the implantation dosage and energy can be optimized in a particular situation.

Figure 3A:
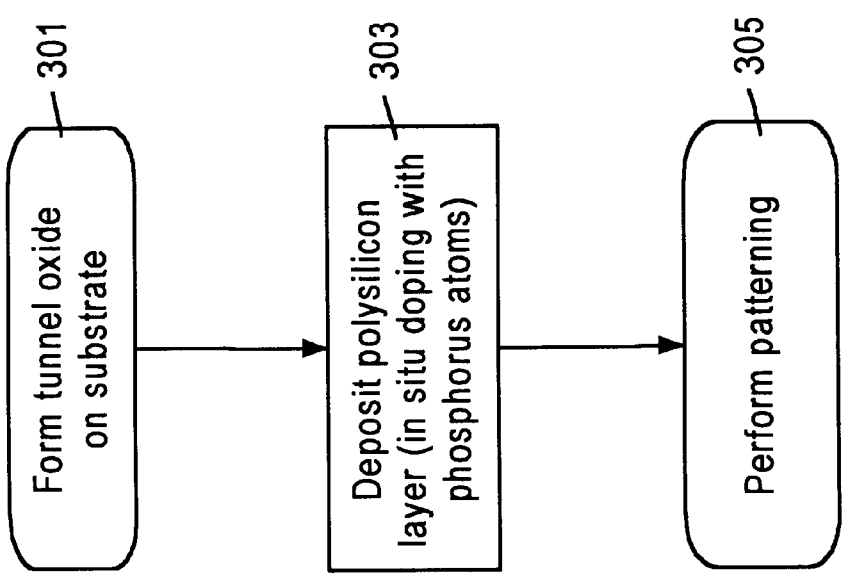
FIG. 3A illustrates the process flow of an embodiment of the present invention involving in situ doping.

In accordance with embodiments of the present invention, as shown in the process flows of FIG. 3A and FIG. 3B, patterning 305, 317 is conducted after completion of the stack of layers. Any of various conventional photolithographic and etching techniques can be employed to effect patterning. For example, the wafer surface is cleaned and dried. Thereafter, a photoresist is applied to the wafer, which then undergoes a softbaking process. Next, the photomask is brought into proper alignment with the wafer, whereby exposure of the photoresist occurs. After exposure, unpolymerized resists are removed, and the wafer is hard baked. Subsequently, an etching process removes the appropriate exposed layer. The photoresist is then removed. Each of the above steps follow standard commercial practices, which may be effectively employed in the practice of the claimed invention.

The precise mechanism involved in achieving the advantages of the present invention by relatively low doping of the floating gate electrode is not known. However, it was found that lightly doping the floating gate imparts a number of key advantages to semiconductor device operations. For example, the reliability of the tunnel oxide increases, is as evidenced by a significant reduction in the HTRB failure rate. Moreover, the lightly doped floating gate exhibits enhanced charge retention. These characteristics contribute to a semiconductor device exhibiting superior properties.

The present invention is applicable to the production of a variety of semiconductor devices, particularly non-volatile memory devices having a design rule of about 0.18 microns and under.

Although several preferred embodiments of the invention have been described in detail above, it should be clear that the present invention is capable of numerous modifications as would be apparent to one of ordinary skill in the art. Such modifications fall within the purview of the appended claims.

What is claimed is:

1. A semiconductor device including a non-volatile memory device comprising:

a tunnel dielectric layer on a semiconductor substrate;

a floating gate electrode, comprising polycrystalline silicon, on the tunnel dielectric layer;

a dielectric layer on the floating gate; and a control gate on the dielectric layer;

wherein the floating gate is doped with impurity atoms at a concentration of about $1 \times 10^{15}$ atoms/cm$^3$ to about $2 \times 10^{20}$ atoms/cm$^3$.

2. The semiconductor device as claimed in claim 1, wherein the floating gate is doped with phosphorous or arsenic impurity atoms.

3. The semiconductor device as in claim 1, wherein the tunnel dielectric layer comprises silicon oxide and has a thickness of about 80 Å to about 120 Å.

4. The semiconductor device as claimed in claim 1, wherein the floating gate has a thickness ranging from about 200 Å to about 3000 Å.

5. The semiconductor device as in claim 4, wherein the floating gate has a thickness of about 500 Å to about 1200 Å.

* * * * *